United States Patent
Beasom

[19]

[11] Patent Number: 6,008,512
[45] Date of Patent: Dec. 28, 1999

[54] SEMICONDUCTOR DEVICE WITH INCREASED MAXIMUM TERMINAL VOLTAGE

[75] Inventor: James D. Beasom, Melbourne Village, Fla.

[73] Assignee: Intersil Corporation, Palm Bay, Fla.

[21] Appl. No.: 08/053,243

[22] Filed: Apr. 28, 1993

[51] Int. Cl.$^6$ ...................................................... H01L 21/90
[52] U.S. Cl. ...................... 257/248; 257/483; 257/630; 257/377; 257/383
[58] Field of Search ................................. 257/485, 630, 257/377, 383, 248

[56] References Cited

U.S. PATENT DOCUMENTS

| | | | |
|---|---|---|---|
| 3,405,329 | 10/1968 | Loro et al. | 257/488 |
| 4,464,825 | 8/1984 | Ports . | |
| 4,692,784 | 9/1987 | Negoro . | |
| 4,954,865 | 9/1990 | Rokos . | |
| 5,136,354 | 8/1992 | Morita et al. . | |

FOREIGN PATENT DOCUMENTS

| | | | |
|---|---|---|---|
| 0341453 | 11/1989 | European Pat. Off. | 257/630 |
| 57-102069 | 6/1982 | Japan | 257/488 |
| 57-97668 | 6/1982 | Japan | 257/488 |

*Primary Examiner*—Carl Whitehead, Jr.
*Assistant Examiner*—Rodner Jerome
*Attorney, Agent, or Firm*—Rogers & Killeen

[57] ABSTRACT

In a semiconductor island structure with passive side isolation, a method and structure for reducing corner breakdown where a device conductor crosses the edge of the island. The decrease in the field strength at the island edge between the conductor and the adjacent conducting region may be achieved by increasing the depth of the insulator beneath the conductor where it crosses the island edge without the necessity for increasing the thickness of the layer of insulation applied directly to the surface of the island by the use of a second or higher level interconnect, e.g., the conventional deposition of one or more additional layers of insulation over the device terminal to increase the spacing between the conductor and the surface of the island. In this way the process by which the device is constructed may remain unchanged. The decrease in the field strength at the island edge may alternatively or in addition be achieved by increasing the thickness of the insulator providing lateral isolation without increasing the thickness of the substrate isolation by the use of lateral trench isolation formed independently of the substrate isolation.

22 Claims, 1 Drawing Sheet

SEMICONDUCTOR DEVICE WITH INCREASED MAXIMUM TERMINAL VOLTAGE

BACKGROUND OF THE INVENTION

The present invention relates to a semiconductor device and method of manufacture in which the terminal voltages of the structures formed in passively isolated islands therein may be increased by the reduction in corner breakdown.

Corner breakdown is a known mechanism in dielectrically isolated ("DI") island structures and is described, for example, in Weston et al "Monolithic High Voltage Gated Diode Array IC", *IDEM* 82, pp. 86–87, as being due to the electric field resulting from the potential difference between an island interconnect and the substrate immediately adjacent the lateral edge of the island when the substrate is biased to fully deplete the corner region by a remote reverse biased PN junction. As described, this problem may be attacked by increasing the uniform thickness of the dielectric to about 5 microns (a) between the island and the biased substrate and (b) overlying the island surface. The high field which passes through the extreme (i.e., within a few microns) lateral edge or corner of the semiconductor island at the point where the interconnect crosses the island edge may cause the generation of hole-electron pairs by avalanche. The collection of such pairs by a remote reverse biased PN junction in the island will thus limit the voltage which can be applied to the PN junction before conduction occurs.

However, the corner breakdown problem occurs not only where the conductor crosses the lateral edge of the island, but where the conductor approaches the island edge. In addition, the 5 micron thickness of the dielectric is generally unacceptable elsewhere in the island, either overlying the island surface or between the island and the substrate. Not only is it rare that the remote bias of a remote PN junction totally depletes the corner region of the island, but the high bias of the substrate required for such depletion exacerbates the corner breakdown problem. Finally, the geometry of the IC may be such that the offending field is between the interconnect and conducting material other than the substrate.

One way to reduce corner breakdown and thus increase maximum terminal voltage, and at the same time to avoid the problems associated with an uniformly thick dielectric, is to increase the thickness of the dielectric only between the conductor and the surface of the island. However, and as earlier explained, an increase in the thickness of the oxide applied to the surface of the island is undesirable for other reasons such as increased stress and increased thermal resistance. Further, such initial thickness undesirably increases the ultimate thickness of the IC where second or higher level island interconnects are used and additional thicknesses of insulation must be applied for each conducting layer. Finally, an increase in the thickness of the insulation overlying the surface of the island increases the difficulty in making the necessary connections between the conductors and the surface, particularly where small contacts are desired e.g., the size and profile of the etch of the insulator and step coverage or thinning of the conductor metal.

It is accordingly an object of the present invention to provide a novel integrated circuit and method of increasing the maximum terminal voltage of a semiconductor device which avoids the problems of uniformly thicker insulation in DI and which is broader in its application to other types of island isolation.

In one aspect, only the thickness of the insulator layer between the conductor and the surface of the island is increased thereby avoiding the problems of thick insulation between the island and the substrate. Further, the thickness may be increased by the use of additional thin insulating layers without the disadvantages associated with a single thick insulating layer.

Another way to reduce corner breakdown and thus increase maximum terminal voltage is to increase only the thickness of the dielectric between the side of the island and the adjacent conducting region to thereby avoid the problems associated with a thick surface layer. As indicated above, and where as is common in DI and SOI isolated islands, the oxide which provides vertical isolation of the island from the underlying substrate and which provides lateral isolation is deposited in the same step and has the same thickness, an increase in the thickness of the oxide is undesirable because of increased stress and defects and increased thermal resistance; in some instances, necessitating a significant increase in the size of the circuit.

It is accordingly another object of the present invention to provide a novel integrated circuit and method of increasing the maximum terminal voltage of a semiconductor device by increasing the effective thickness of the insulator layer between the conductor and the adjacent conducting region without the disadvantages associated with a uniformly thick insulator for the island. Further, the thickness of the lateral insulation may be varied around the perimeter of the island to accommodate the location of interconnects and other circuit elements.

It is yet another object of the present invention to provide a novel integrated circuit and method of increasing the maximum terminal voltage of a semiconductor device without the uniform bias requirements of the prior art. In one aspect, the invention effects electrical separation of the vertical and lateral substrates, thus permitting separate biasing.

These and many other objects and advantages will be readily apparent to one skilled in the art to which the invention pertains from the claims and from a perusal of the following detailed description of preferred embodiments when read in conjunction with the appended drawings.

DESCRIPTION OF PREFERRED EMBODIMENTS

Figure 1:
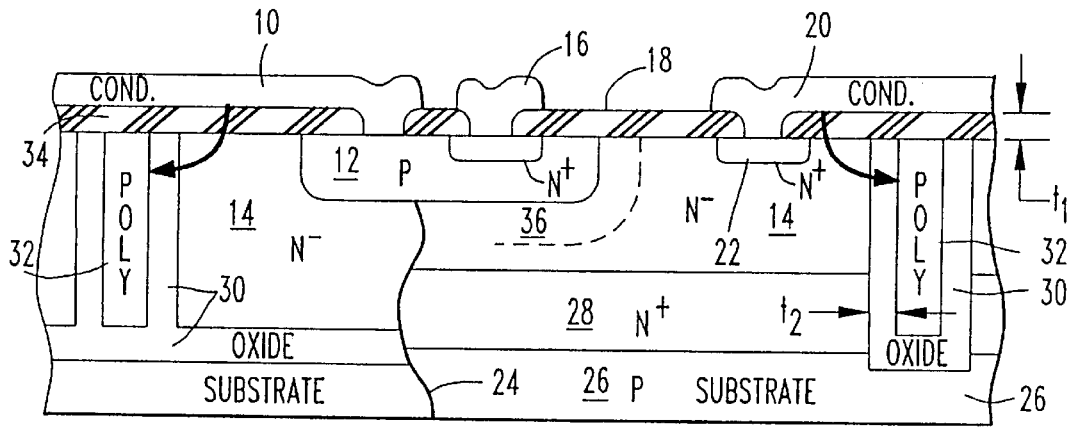
FIG. 1 is a pictorial representation and an elevation of a cross-section of a known semiconductor device.

With reference to FIG. 1, a vertical NPN transistor is illustrated in an island of a semiconductor device. As illustrated, a base conductor 10 is electrically connected to a P doped well 12 within an island of N− doped semiconductor 14. An emitter conductor 16 is illustrated in contact with N+ doped semiconductor well 18 within the P doped base region 12. A collector conductor 20 is illustrated in contact with the N− doped collector 14, with the N+ region 22 being utilized in a conventional manner for contact purposes.

In the illustration of FIG. 1, the island is divided along the line 24 to illustrate different island structures. However, in a practical embodiment, the structure would be the same on both sides of line 24.

The portion of the island to the right of line 24 is a typical junction isolated or "JI" structure in which the N– doped collector 14 is supported on a P doped substrate 26 by an N+ doped region 28, the PN junction between the regions 26 and 28 providing isolation of the NPN transistor within the island. Laterally, isolation is provided by a conventional trench which comprises a silicon oxide layer 30 with a polysilicon or other conductor 32 filled therein.

To the left of the line 24, the isolation is a form of silicon on insulator or "SOI" and the N– doped collector 14 is supported on a substrate by a silicon oxide insulator 30 integral with the polysilicon filled lateral trench.

With continued reference to FIG. 1, the conductors 10, 16 and 18 are isolated from the upper service of the island by a dielectric layer 34 applied in a conventional process to a thickness t1. As represented by the heavy curved arrows in both the left and right hand sides of the drawing, a field exists between the conductors 10 and 20 and the polysilicon fill 32 of the lateral trench by virtue of the potential difference therebetween.

As is evident from the drawing, the field passes through the lateral edges or corners of the collector 14 and, if the field exceeds the critical field, hole-electron pairs are generated by avalanche and will migrate towards the depletion region 36 surrounding the base 12. The hole-electron pairs will be collected by a reverse biased junction and thus, limit the voltage which can be applied across the junction before it breaks down and conducts. In this way, the corner breakdown limits the terminal voltage of the NPN transistor within the island.

The corner breakdown can be approximated by the equation:

$$BV \geq \frac{e_s}{e_i} \cdot (t_1 + t_2) E_c$$

where

BV equals the corner breakdown voltage, $e_s$ equals the dielectric constant of semiconductor, $e_i$ equals the dielectric constant of insulator, $t_1$ equals the thickness of insulator between the conductor and the island, $t_2$ equals the thickness of the insulator between the island and the adjacent conductive region, and $E_c$ equals the critical field for breakdown within the semiconductor.

As may be seen from the above equation, the corner breakdown voltage increases directly with the thickness of the insulators between the conductor and the adjacent conducting region. However, as earlier indicated, increased oxide thickness of the layer immediately overlying the island, as well as increased oxide thickness of the vertical isolation layer, has been found undesirable.

In the present invention, an increase in the thickness of the insulator in the area beneath the conductor adjacent the edge of the island is obtained without an increase in the insulator layer immediately overlying or supporting the island.

Figure 2:
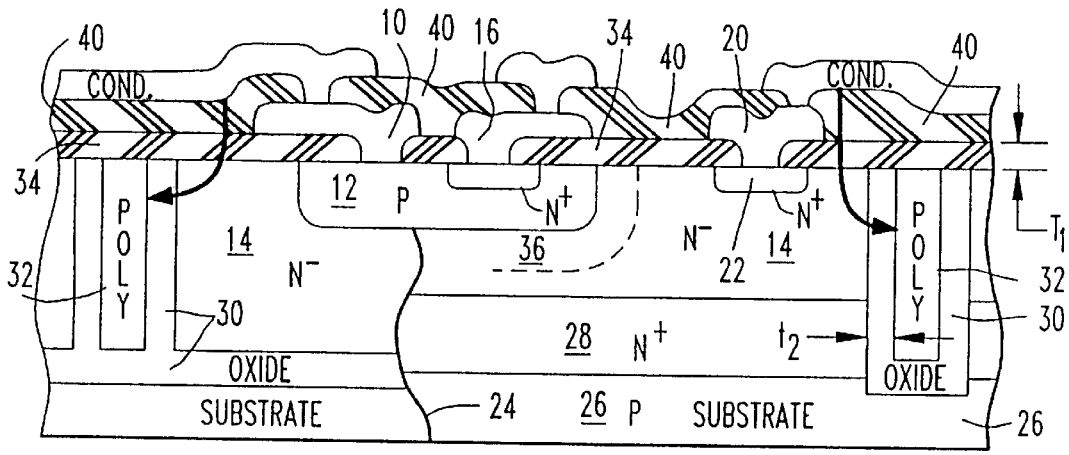
FIG. 2 is a pictorial representation and an elevation illustrating one embodiment of the modification of FIG. 1 in accordance with the present invention.

As shown in FIG. 2, where like elements have been accorded like numerical designations, an additional insulating layer 40 is provided overlying the first insulating layer 34. As shown on the right hand side of FIG. 2, the combined thickness of the insulator between the conductor and the surface of the island has been increased to a minimum thickness of $T_1$. By way of example, in a trench isolated DI process, the thickness of the trench isolation oxide 30, the field-oxide 34 and the inter-level oxide layer 40 may each be one micron thick. Using a second level interconnect to cross the island edge as shown in FIG. 2 would increase the depth of dielectric by the factor 3/2 and thus produce a 50% increase in the corner breakdown voltage.

Figure 3:
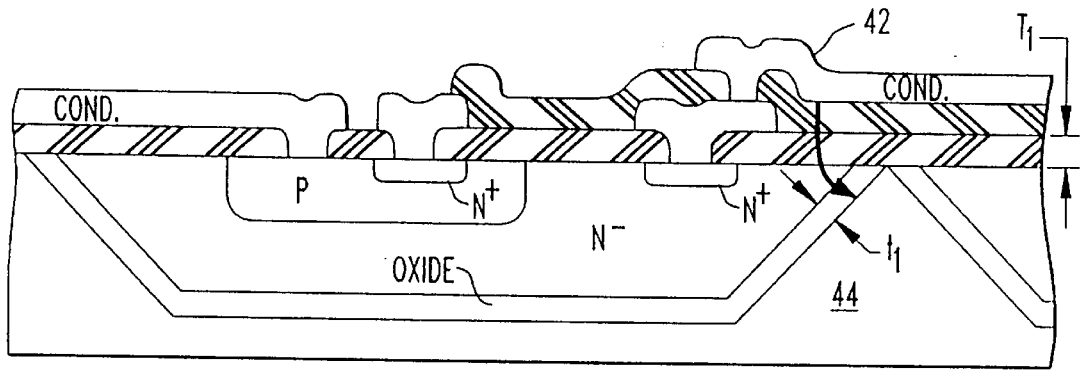
FIG. 3 is a pictorial representation, and an elevation of a semiconductor device incorporating the present invention.

A further dielectrically isolated embodiment of the present invention is illustrated in FIG. 3 wherein the field represented by the heavy arrow between the conductor 42 and the substrate 44 passes through two layers of oxide on the surface of the island, with this increase in the surface insulation to a thickness $T_1$ producing a corresponding increase in the breakdown voltage at the corner of the island.

In accordance with the present invention, the second insulation area need not cover the entire surface of the device, but may be selectively applied in the area beneath the conductor where it approaches the edge of the island.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of increasing maximum terminal voltage of a semiconductor island passively isolated from an adjacent conductive region comprising the steps of:

a. providing an island passively isolated from an adjacent conductive region;

b. covering the surface of the island with a first insulating layer;

c. establishing a contact to a surface area of the island through the first insulating layer;

d. covering at least a portion of the lateral edge of the island with a second insulating layer; and e. establishing an electrical connection between the contact and a conductor which extends laterally over the edge of the island and the adjacent conductive region and which is vertically spaced from the surface of the island and the adjacent conductive region by both the first and the second insulating layers.

2. In an integrated circuit including (i) a semiconductor island having a device, (ii) a lateral insulator, (iii) an adjacent conducting region separated from the island by the lateral insulator, and (iv) a device terminal conductor overlying a portion of the device, the lateral insulator and the adjacent conducting region, the island, lateral insulator and adjacent conducting region sharing a common surface, and the device terminal conductor being spaced from the common surface by an insulation layer immediately adjacent the common surface, a method of reducing the tendency for corner breakdown as a result of a field which passes through a corner of the island between the device terminal conductor and the adjacent conducting region by increasing the thickness of an insulation between the terminal conductor and the adjacent conducting region without increasing the thickness of the insulation layer immediately adjacent the surface of the island.

3. The method of claim 2 wherein the insulation is increased by the addition of at least one additional insulating layer over the island surface in the area over which the conductor will pass before the conductor is connected to the terminal of the device.

4. The method of claim 2 wherein the isolating insulator is an insulating trench; and wherein the thickness of the insulation is increased by increasing the lateral thickness of the insulating trench laterally defining the island in the area over which the device terminal conductor will pass before the device terminal conductor is connected to the terminal of the device.

5. The method of claim 4 wherein the trench laterally defining the island is an insulator filled with a conducting material; and wherein the insulation is increased by increasing the width of the insulation of the trench between the island and the conducting material.

6. In a semiconductor device having an island with passive side isolation from a conductive region, insulation applied directly to the surface of the island in selected areas thereof, and a conductor which extends over a lateral edge of the island and the adjacent conductive region separated from the surface of the island by the insulation, the method of increasing the maximum terminal voltage of the device by the step of increasing the thickness of the insulation between the conductor and the surface of the island adjacent the lateral edge thereof and the adjacent conductive region without increasing the thickness of the insulation applied directly to the surface of the island in other areas, to thereby reduce corner breakdown due to the portion of the field which passes through the island between (i) the conductor and (ii) the adjacent conductive region.

7. The method of claim 6 wherein the island is dielectrically isolated and the adjacent conductive region is a second island.

8. The method of claim 6 wherein the island is junction isolated with a lateral trench filled with a conductive material.

9. The method of claim 6 wherein the thickness of the insulation beneath the conductor adjacent the lateral edge of the island is increased by providing at least one layer of insulation over the layer of insulation immediately overlying the surface of the island adjacent the lateral edge thereof.

10. A method of increasing the maximum terminal voltage of structures formed in islands with passive side isolation and a layer of insulation applied directly to the surface of the islands in selected areas including the area where the conductor crosses the island edge comprising the step of increasing the thickness of an insulation between the conductor with the largest potential difference to the adjacent conductive region in the area where the conductor crosses the island edge without increasing the thickness on the layer of insulation applied directly to the surface of the island in other areas thereof.

11. A method comprising the steps of:
(1) providing a semiconductor device with (a) an island having a junction and an island contact, (b) passive side isolation, (c) a junction conductor, (d) an island contact conductor, and (e) insulation in direct contact with the surface of the island in selected areas including the area beneath the island contact conductor; and
(2) increasing the depth of the insulation beneath the island contact conductor where such conductor crosses the island edge,
to thereby increase the maximum terminal voltage of the device.

12. In a semiconductor device having a junction and an island contact where the device is within a semiconductor island passively isolated from an adjacent conductive region and where a contact conductor passes over the edge of the island separated from the surface thereof by a layer of insulation, a method of increasing the maximum terminal voltage of the device by the step of increasing the thickness of the insulation separating the contact conductor from the island surface, to thereby reducing the field which exists in the island between the contact conductor and the adjacent conductive region resulting from the passage of current through the contact conductor.

13. The method of claim 12 wherein the passive isolation is provided by an oxide trench and wherein the adjacent conductive region is provided by polysilicon within the trench.

14. The method of claim 12 wherein the isolation is provided by a DI substrate.

15. The method of claim 12 wherein the isolation is provided by a SOI substrate.

16. The method of claim 12 where the depth of the insulation between the contact conductor and the island surface is increased without increasing the depth of the layer of insulation immediately adjacent the island surface in areas other than the area where the contact conductor passes over the edge of the island.

17. An IC comprising:
a semiconductor island passively isolated laterally from an adjacent conductive region and vertically isolated from a substrate, said island having at least one surface contact area;
a first dielectric layer overlying the surface of the island except in areas overlying said surface contact areas;
a surface contact in electrical contact with said surface contact area and overlying said first dielectric area in the areas immediately adjacent thereto;
a second dielectric layer overlying said first dielectric layer and said surface contact except in an contact area of said surface contact;
an electrical conductor in electrical contact with the contact area of said surface contact and overlying a portion of said second dielectric layer along a path extending laterally from said contact over the edge of the island and the adjacent conductive region,
whereby the separation of said conductor from said surface by said first and second dielectric layers results in a susceptibility to corner breakdown less than the susceptibility which would result from only one of said dielectric layers.

18. The IC of claim 17 wherein the thickness of the lateral isolation is the same as the thickness of the vertical isolation.

19. The IC of claim 17 wherein said substrate and said conductive region are electrically isolated.

20. The IC of claim 17 wherein said lateral isolation includes a polysilicon filled oxide trench.

21. In an integrated circuit including (i) a semiconductor island having a device, (ii) a lateral insulator, (iii) an adjacent conducting region separated from the island by the lateral insulator, and (iv) a device terminal conductor overlying a portion of the device, the lateral insulator and the adjacent conducting region, the island, lateral insulator and adjacent conducting region sharing a common surface, and the device terminal conductor being spaced from the common surface by an insulation layer immediately adjacent the common surface, a method of reducing the tendency for corner breakdown as a result of a field which passes through a corner of the island between the device terminal conductor and the adjacent conducting region by increasing the depth of an insulation between the device terminal conductor and the adjacent conducting region without increasing the depth of the insulation between the device terminal conductor and the island.

22. The method of claim 21 wherein the lateral insulator includes a polysilicon filled oxide trench.

* * * * *